United States Patent [19]
Inoue et al.

[11] Patent Number: 6,084,333
[45] Date of Patent: Jul. 4, 2000

[54] SURFACE ACOUSTIC WAVE DEVICE

[75] Inventors: Shinji Inoue, Souraku-gun; Akihiko Kataoka, Jyoyou; Shin Murakami, Kyoto; Takayuki Shimizu, Uji; Tetsuo Niwa, Kokubu, all of Japan

[73] Assignee: Kyocera Corporation, Kyoto, Japan

[21] Appl. No.: 09/212,131

[22] Filed: Dec. 15, 1998

[30]  Foreign Application Priority Data

Dec. 16, 1997 [JP] Japan .................................. 9-346883
Jan. 29, 1998 [JP] Japan ................................ 10-017095
Mar. 26, 1998 [JP] Japan ................................ 10-079784

[51] Int. Cl.[7] ................................................. H01L 41/08
[52] U.S. Cl. ....................................................... 310/313 A
[58] Field of Search ............................. 310/313 A, 313 R

[56]  References Cited

U.S. PATENT DOCUMENTS 5,905,325  5/1999  Naumenko et al. ................. 310/313 A

FOREIGN PATENT DOCUMENTS 9725776  7/1997  European Pat. Off. ......... H03H 9/17

*Primary Examiner*—Thomas M. Dougherty
*Attorney, Agent, or Firm*—Hogan & Hartson LLP

[57]  ABSTRACT

On a substrate made of a single crystal of $La_3Ga_{5.5}Nb_{0.5}O_{14}$, an excitation electrode 2 for generating a surface acoustic wave is provided to produce a surface acoustic wave device S. The cutting angles of the substrate and the direction of propagation of the surface acoustic wave are defined in Eulerian angle indication ($\phi$, $\theta$, $\psi$) by $\phi=50°+60°\times m1$, $\theta=125°+180°\times m2$ and $\psi=40°+180°\times m3$ (where m1, m2 and m3 are integers). Eulerian angles may be $\phi=10°+60°\times n1$, $\theta=125°+180°\times n2$, and $\psi=70°+180°\times n3$ (where n1, n2 and n3 are integers) or $\phi=a1+60°\times b1$, $\theta=a2+180°\times b2$ and $\psi=a3+180°\times b3$ (where $0°\leq a1\leq 60°$, $125°\leq a2\leq 165°$, $110°\leq a3\leq 165°$, and b1, b2 and b3 are integers).

3 Claims, 10 Drawing Sheets

SURFACE ACOUSTIC WAVE DEVICE

FIELD OF THE INVENTION

The present invention relates to a surface acoustic wave device such as surface acoustic wave filter and surface acoustic wave vibrator that uses a single crystal of $La_3Ga_{5.5}Nb_{0.5}O_{14}$ being one of lanthanum-gallium-niobium series oxides.

PRIOR ART

A surface acoustic wave device wherein an excitation electrode for generating a surface acoustic wave is provided on a piezoelectric substrate is known. Single crystals of quartz, lithium niobate, lithium tantalate, etc. have been put to practical use as materials of the substrate of this surface acoustic wave device.

Of these single crystal materials, quartz crystal changes little in characteristics with temperature. Hence it has been used favorably for filter, resonator, etc. of portable telephone, etc. Quartz crystal, however, has a demerit that its electro-mechano coupling coefficient is small, and in turn, its band-pass width is narrow.

On the other hand, lithium niobate and lithium tantalate have a merit that their band-pass widths are broad, and they are used favorably for filters, etc. of portable telephone, VTR, etc. They, however, have a demerit that their band width frequencies change significantly with temperature (frequency-temperature characteristics).

A single crystal of lithium tetraborate is known as a material that covers the defects of the above-mentioned materials. The single crystal of lithium tetraborate, however, poses a problem of deliquescence unique to this single crystal. Because of this problem, it requires hermetic seal. This, in turn, requires a larger size of the device and a higher cost. Hence the single crystal of lithium tetraborate has not been suitable to practical mass production.

In recent years, much attention has been given to langasite ($La_3Ga_5SiO_{14}$) as a material that meet all the above-mentioned requirements (for example, H. Satoh and A. Mori: Jpn. J. Appl. Phys. Vol. 36 (1977) pp. 3071–3063); langasite has a cutting plane and a direction of propagation of which electro-mechano coupling coefficient ($k^2$) being proportional to pass-band width is large and group retardation temperature coefficient (TCD) is small. The electro-mechano coupling coefficient and the group retardation temperature coefficient are used as performance evaluation indices of piezoelectric materials.

More recently, a special attention has been given to single crystals of lanthanum-gallium-niobium series oxides having similar crystal structures to langasite, in particular, a single crystal of $La_3Ga_{5.5}Nb_{0.5}O_{14}$ (hereinafter referred to as LGN) as a piezoelectric material. Much hope is placed on LGN because its TCD is as small as that of quartz crystal and its $k^2$ is greater than that of the above-mentioned langasite. As the surface acoustic wave velocity of LGN is slow, LGN is expected to be advantageous in reducing the size of the device.

However, no report has been made regarding optimal cutting angles and an optimal direction of propagation of surface acoustic wave for the above-mentioned LGN.

SUMMARY OF THE INVENTION

One objective of the present invention is to provide a surface acoustic wave device having optimal cutting angles and an optimal direction of propagation of surface acoustic wave for LGN that has superior characteristics in comparison with the conventional piezoelectric materials.

To accomplish the above-mentioned objective, the present inventors searched for a cutting face and a direction of propagation of surface acoustic wave at which the basic characteristics such as electro-mechano coupling coefficient and group retardation temperature coefficient are optimal through computer simulations and experiments. The computer simulations were based on characteristics data of a single crystal of $La_3Ga_{5.5}Nb_{0.5}O_{14}$ (LGN) that were experimentally measured by actually growing the single crystal. As a result, the present inventors have found that in a surface acoustic wave device wherein an excitation electrode for generating a surface acoustic wave is formed on an LGN substrate actually produced cutting angles of the substrate and a direction of propagation of the surface acoustic wave that satisfy, in the right-handed system Eulerian angle indication ($\phi$, $\theta$, $\psi$), $\phi=50°+60°\times m1$, $\theta=125+180°\times m2$, $\psi(40°+180°\times m3)$ (where m1, m2 and m3 are integers) are appropriate. The extents of errors permitted to $\phi$, $\theta$ and $\psi$ are $\pm 5°$, $\pm 10°$ and $\pm 10°$, respectively.

The present inventors also have found that cutting angles of the substrate and a direction of propagation of the surface acoustic wave that satisfy, in the right-handed system Eulerian angle indication ($\phi$, $\theta$, $\psi$), $\phi=10°+60°\times n1$, $\theta=125°+180°\times n2$, $\psi=70°+180°\times n3$ (where n1, n2 and n3 are integers) are appropriate. The extents of errors permitted to parameters $\phi$, $\theta$ and $\psi$ are $\pm 5°$, $\pm 10°$ and $\pm 10°$, respectively.

When the surface acoustic wave generated is Rayleigh wave, it is optimal in realizing a smaller device.

The present inventors also have found that cutting angles of the substrate and a direction of propagation of the surface acoustic wave in Eulerian angle indication ($\phi$, $\theta$, $\psi$) satisfying $\phi=a1+60°\times b1$, $\theta=a2+180°\times b2$, $\psi=a3+180°\times b3$ (where $0°\leq a1 \leq 60°$, $125°\leq a2 \leq 165°$, $110°\leq a3 \leq 165°$, and b1, b2 and b3 are integers) are favorable.

The present inventors also have found that cutting angles of the substrate and a direction of propagation of the surface acoustic wave in Eulerian angle indication ($\phi$, $\theta$, $\psi$) satisfying $\phi=c1+60°\times d1$, $\theta=c2+18°\times d2$, $\psi=c3+180°\times d3$ (where $0°\leq c1 \leq 60°$, $190°<c2<215°$, $50°\leq c3 \leq 90°$, and d1, d2 and d3 are integers) are favorable.

As shown in FIG. 1, when crystallographic axes are X, Y and Z, a direction of propagation of the surface acoustic wave is a; a direction perpendicular to the substrate is c, and a direction perpendicular to both a and c is b, ($\phi$, $\theta$, $\psi$) indicated in the diagram is Eulerian angle indication. Specifically, the X axis is defined to be the <1•1•0> direction of a single crystal of LGN. The above-mentioned Eulerian angle notation can take various values as described above because LGN of point group P321 has symmetry and periodicity to surface acoustic wave.

As described so far, in a surface acoustic wave device according to the present invention, an excitation electrode is formed on an optimal cutting plane of a substrate. Hence the present invention can provide a surface acoustic wave device with an excellent substrate of which group retardation temperature coefficient (TCD) is approximately zero and electro-mechano coupling coefficient ($k^2$) is extremely large.

Moreover, in a single crystal of $La_3Ga_{5.5}Nb_{0.5}O_{14}$, the velocity of a surface acoustic wave is relatively small. Hence the size of the device can be reduced easily when it is to be used as a low frequency filter. In particular, the present invention can provide an excellent surface acoustic wave device as band-pass filter.

Furthermore, the present invention can provide a surface acoustic wave device that has an excellent substrate in which the surface acoustic wave velocity (v) is slow and the power flow angle (PFA) is small.

When Rayleigh wave is used as a surface acoustic wave that is to be propagated on the substrate, the present invention can provide an excellent low frequency filter that is reduced in size.

EMBODIMENT

In the following, with reference to the drawings, the embodiment of the present invention will be described in detail. A single crystal of $La_3Ga_{5.5}Nb_{0.5}O_{14}$ (LGN) being a lanthanum-gallium-niobium series oxide single crystal is produced by heating a crucible containing a raw material of the single crystal (a mixture of $La_2O_3$, $Ga_2O_3$ and $Nb_{0.5}$ or $La_3Ga_{5.5}Nb_{0.5}O_{14}$ or the like) to a specified temperature in a single crystal growth furnace of high-frequency heating type or resistance heating type, introducing a seed into the melt and withdrawing the seed from the melt at a specified number of rotation and a specified pulling velocity in relation to the melt.

Next, a substrate having a cutting plane of $\phi=50°\pm5°$ and $\theta=125°\pm10°$ in Eulerian angle indication ($\phi, \theta, \psi$) is cut out of the grown single crystal obtained. The substrate is mirror-plane-polished. Then an excitation electrode is formed on the substrate in the direction of propagation of the surface acoustic wave or $\psi=40°\pm10°$ to produce, for example, a propagation type surface acoustic wave device S shown in FIG. 2.

Or a substrate having a cutting plane of $\phi=10°$ (tolerable in a range of from 5° to 15°) and $\theta=35°$ (tolerable in a range of from 25° to 45°) in Eulerian angle indication ($\phi, \theta, \psi$) is cut out of the grown single crystal obtained. The substrate is mirror-plane-polished. Then an excitation electrode is formed on this substrate in the direction of propagation of the surface acoustic wave or $\psi=70°$ (tolerable in a range of from 60° to 80°).

Moreover, a substrate having a cutting plane of $\phi=60°~120°$ and $\theta=125°~165°$ in Eulerian angle indication ($\phi, \theta, \psi$) is cut out of a grown single crystal obtained. The substrate is mirror-plane-polished on one face. An excitation electrode is formed on the substrate in the direction of propagation of the surface acoustic wave or $\psi=110°~165°$ to produce a surface acoustic wave device, for example, a propagation type surface acoustic wave filter shown in FIG. 2 or a resonant type surface acoustic wave filter shown in FIG. 11. In a similar manner, a propagation type surface acoustic wave device having a cutting plane of $\phi=60°~120°$ and $\theta=190°~215°$ and an excitation electrode of $\psi=50°~90°$ is produced.

Figure 2:
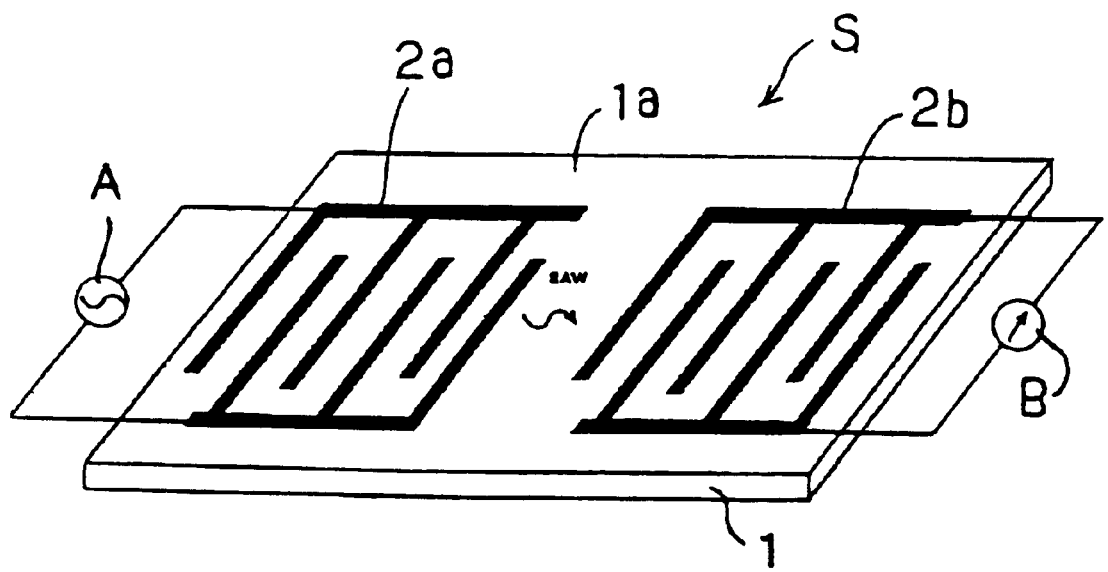
FIG. 2 is a perspective view schematically showing a surface acoustic wave device according to the present invention.

In the case of the propagation type surface acoustic wave device S shown in FIG. 2, a metal film of aluminum etc. is formed on a cutting plane $1a$ of a substrate 1 by vacuum evaporation. After that, comb-shaped excitation electrodes $2a$ (input side) and $2b$ (output side) are formed by the lift-off process or the etching process. A in the diagram denotes a power source for inputting an alternating-current signal to the excitation electrode of the input side, and B denotes a detector for detecting an electric signal. A surface acoustic wave device may be of the resonant type. In such a case, a metal film of aluminum etc. is formed on a cutting plane $1a$ of a substrate 1 by vacuum evaporation. After that, comb-shaped IDT electrodes or reflector electrodes are formed by the lift-off process or the etching process. A plurality of such resonators may be connected in a ladder type, a lattice type or a mixture type of these types to form a circuit.

The reason for setting $\phi$, $\theta$ and $\psi$ at the above-mentioned angles is that the present inventors have confirmed that the crystal orientation of the substrate face and the direction of propagation of the above-mentioned ranges have the most favorable basic characteristics for a band-pass filter through computer simulations and experiments.

As for the analytical method of these computer simulations, physical data of the single crystals grown as described above were used and the method of Cambell et al (for example, J. J. Cambell et al: IEEE. Trans. Sonics. Ultrason. 15(1968)209) was used. Parameters used were c-constant ($N/m^2$), e-constant ($C/m^2$), relative dielectric constant, coefficient of linear expansion, density ($kg/M^3$), and their first-order temperature coefficient (/° C.) and second-order temperature coefficient(/° $C.^2$).

Figure 5:
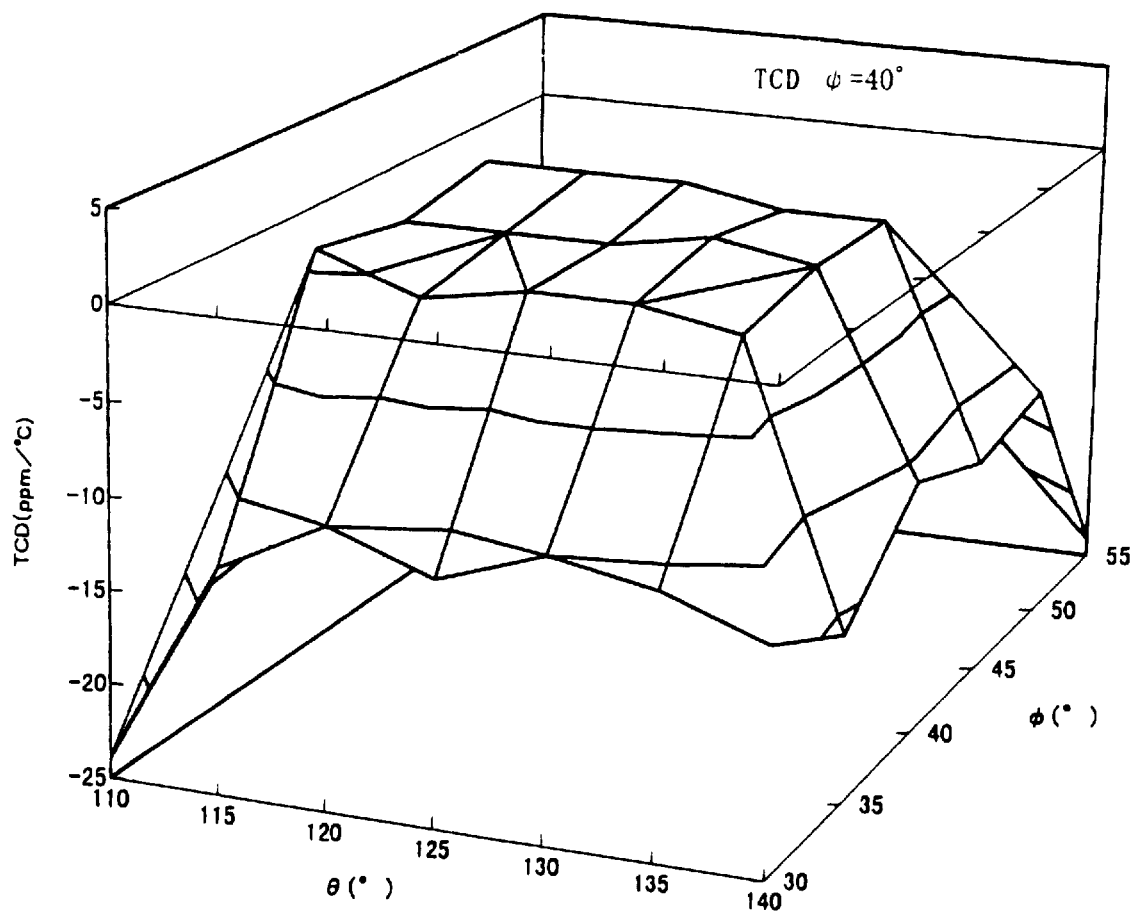
FIG. 5 is a graph indicating the relationship between the cutting plane and TCD when $\psi=40°$.
Figure 6:
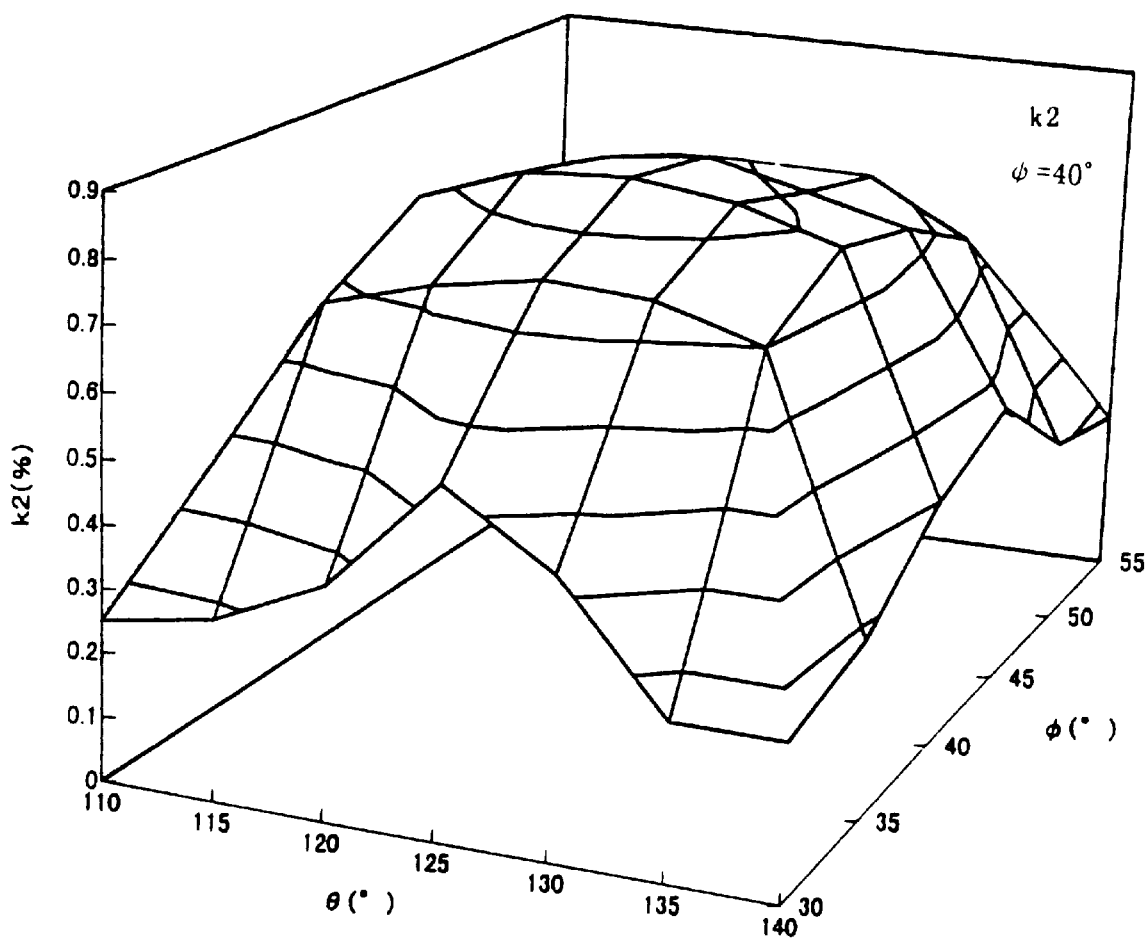
FIG. 6 is a graph indicating the relationship between the cutting plane and $k^2$ when $\psi=40°$.

On the basis of the results of the above-mentioned simulation, as shown in FIG. 5 and FIG. 6, a cutting plane and a direction of propagation of the surface acoustic wave of which electro-mechano coupling coefficient ($k^2$) is large and group retardation temperature coefficient (TCD) at room temperature is 0° C./ppm have been found to be ($\phi, \theta, \psi$)=(50°+60°m1, 125°+180°m2, 40°+180°m3). m1 through m3 are integers.

On the basis of the results shown in FIG. 5, when $\psi$ is approximately 40°, TCD is approximately zero if $\phi$ is from 45° to 55° and $\theta$ is from 112° to 135°. Moreover, on the basis of the results shown in FIG. 6, when $\psi$ is approximately 40° $k^2$ is 0.80% or over if $\phi$ is from 41° to 56° and $\theta$ is from 115° to 132°. As for the value of $k^2$, the higher, the better. The reason for setting the standard of $k^2$ at 0.80% is that the approximate lower boundaries of $k^2$ of $LiTaO_3$ single crystal and lithium tetraborate single crystal that have been put to practical use are approximately 0.80%.

The above-mentioned Eulerian angle indication can take the above-mentioned respective values because of the symmetry of LGN of point group P321 and its periodicity to the surface acoustic wave.

That is to say, the angles of $\phi=50°=110°=170°=230°=290°=350°$ and the angles of $\theta=125°=305°$ can be treated as equal angles, respectively.

Figure 3:
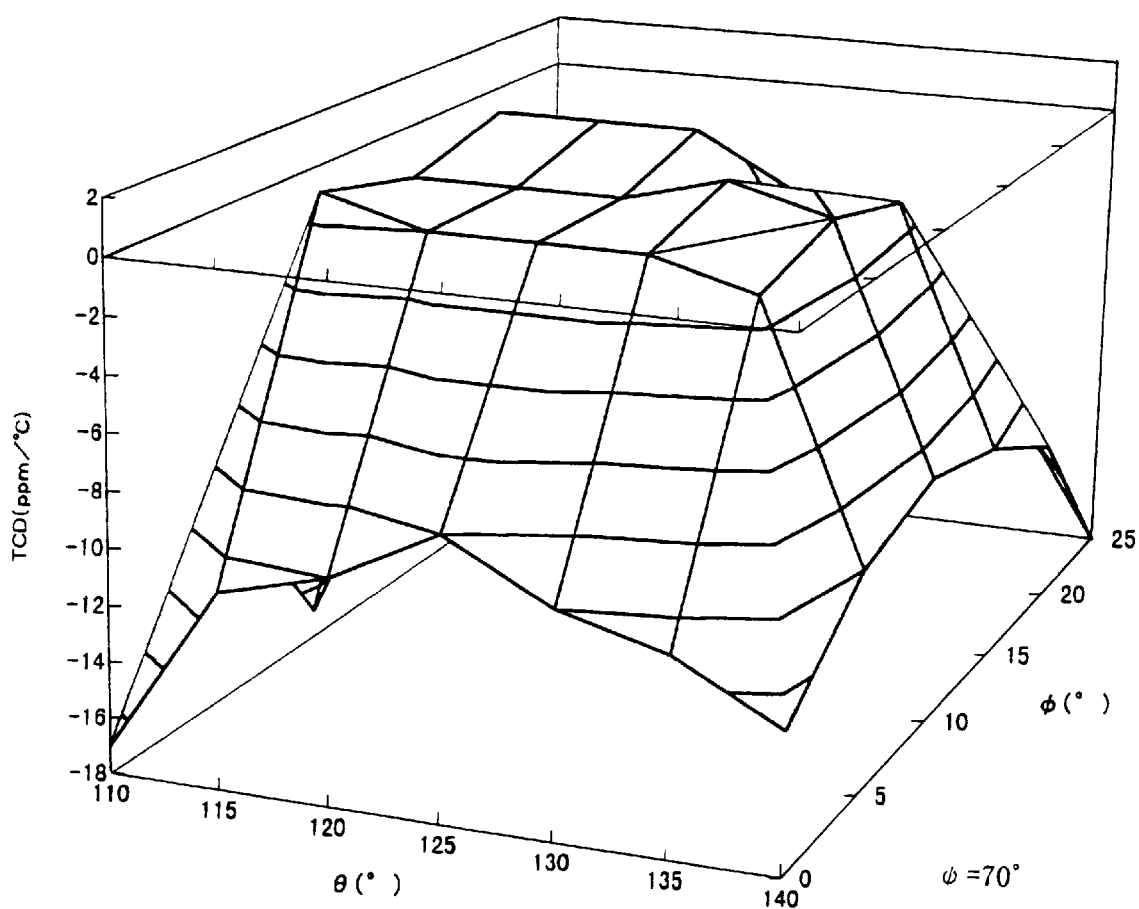
FIG. 3 a graph indicating the relationship between the cutting plane and TCD when $\psi=70°$.
Figure 4:
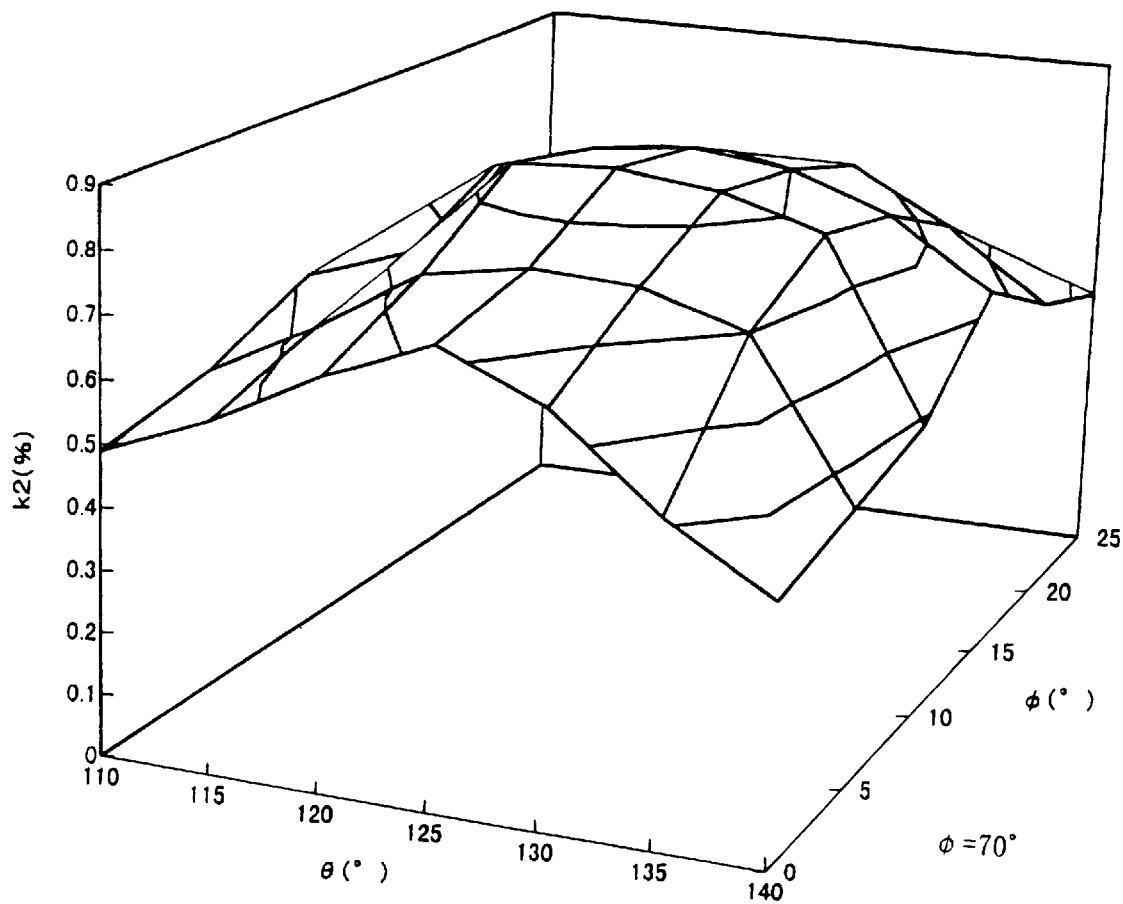
FIG. 4 is a graph indicating the relationship between the cutting plane and $k^2$ when $\psi=70°$.

As shown in FIG. 3 and FIG. 4, a cutting plane and a direction of propagation of the surface acoustic wave of which electro-mechano coupling coefficient ($k^2$) is large and group retardation temperature coefficient (TCD) at room temperature is approximately 0° C./ppm have been found to be $(\phi, \theta, \psi)=(10°+60°\times n1, 125°+180°n2, 70°+180°\times n3)$. $n1$ through $n3$ are integers.

On the basis of the results shown in FIG. 3, when $\psi$ is approximately 70° (70°±10°), TCD is approximately zero if $\phi$ is from 3° to 17° and $\theta$ is from 112° to 135°. Moreover, on the basis of the results shown in FIG. 4, when $\psi$ is approximately 70°, $k^2$ is 0.80% or over if $\phi$ is from 5° to 17° and $\theta$ is from 25° to 45°. As for the value of $k^2$, the higher, the better. The reason for setting the standard of $k^2$ at 0.80% is that the approximate lower boundaries of $k^2$ of $LiTaO_3$ single crystal and lithium tetraborate single crystal that have been put to practical use are approximately 0.80%.

Here, again, the above-mentioned Eulerian angle indication can take the above-mentioned respective values because of the symmetry of LGN of point group P321 and its periodicity to the surface acoustic wave. For example, in the first crystal, the angles of $\phi=10°$, 70°, 130°, 190°, 250° and 310° and the angles of $\theta=125°$, 305° can be treated as equal angles, respectively.

On the basis of the above-mentioned computer simulation, a cutting plane and a direction of propagation of the surface acoustic wave of which surface acoustic wave velocity is favorably slow, electro-mechano coupling coefficient ($k^2$) is large and both group retardation temperature coefficient (TCD) and power flow angle (PFA) at room temperature are approximately zero have been found to satisfy, in Eulerian angle indication $(\phi, \theta, \psi)$, $\phi=a1+60°\times b1$, $\theta=a2+180°b2$, $\psi=a3+180°b3$ (where $0°\leq a1\leq 60°$, $125°\leq a2\leq 165°$, $110°\leq a3\leq 165°$, and b1, b2 and b3 are integers).

Moreover, it has been found that when $\phi=c1+60°\times d1$, $\theta=c2+180°\times d2$, $\psi=c3+180\times d3$ (where $0°\leq c1\leq 60°$, $190°\leq c2\leq 215°$, $50°\leq c3\leq 90°$, and d1, d2 and d3 are integers) are satisfied, similar results are obtained.

In particular, in a range of $\phi=90°\sim 115°$, in Eulerian angle indication $(\phi, \theta, \psi)$,
(90°, 150°~160°, 115°~125°),
(90°, 200°~210°, 55°~65°)
(95°, 150°~160°, 120°~130°),
(95°, 200°~210°, 60°~70°),
(100°, 145°~155°, 125°~135°),
(100°, 195°~205°, 65°~75°),
(105°, 145°~155°, 130°~140°),
(105°, 195°~205°, 70°~80°),
(110°, 140°~150°, 140°~150°),
(110°, 195°~205°, 75°~85°),
(115°, 135°~145°, 145°~160°) and
(115°, 195°~205°, 80°~90°) have been found to be ranges of which TCD and PFA are approximately zero and $k^2$ is approximately 0.4% and is as large as three or four times of ST cut quartz crystal.

Figure 7:
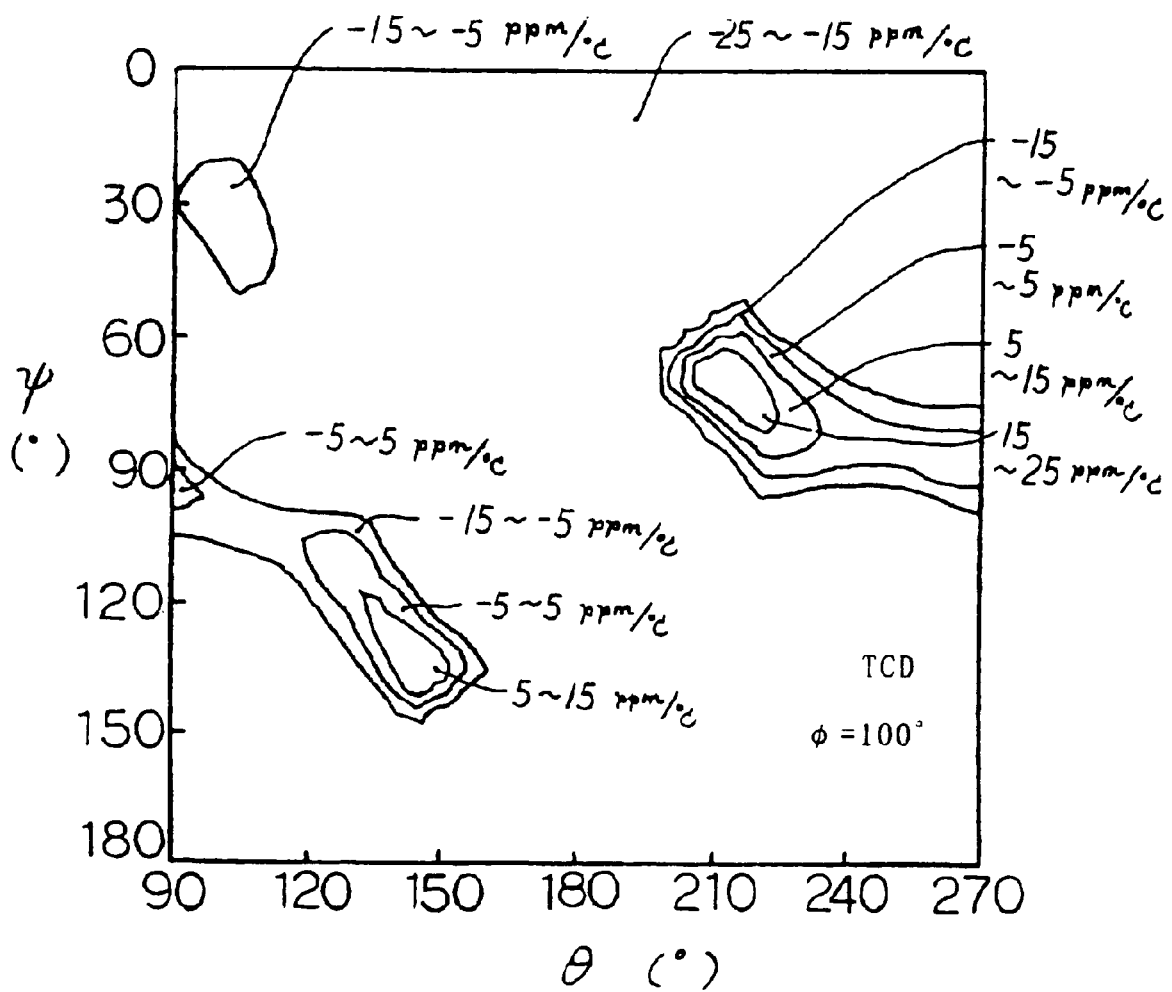
FIG. 7 is a graph indicating the relationship between the direction of propagation and the group retardation temperature coefficient (TCD) when $\phi=100°$.
Figure 8:
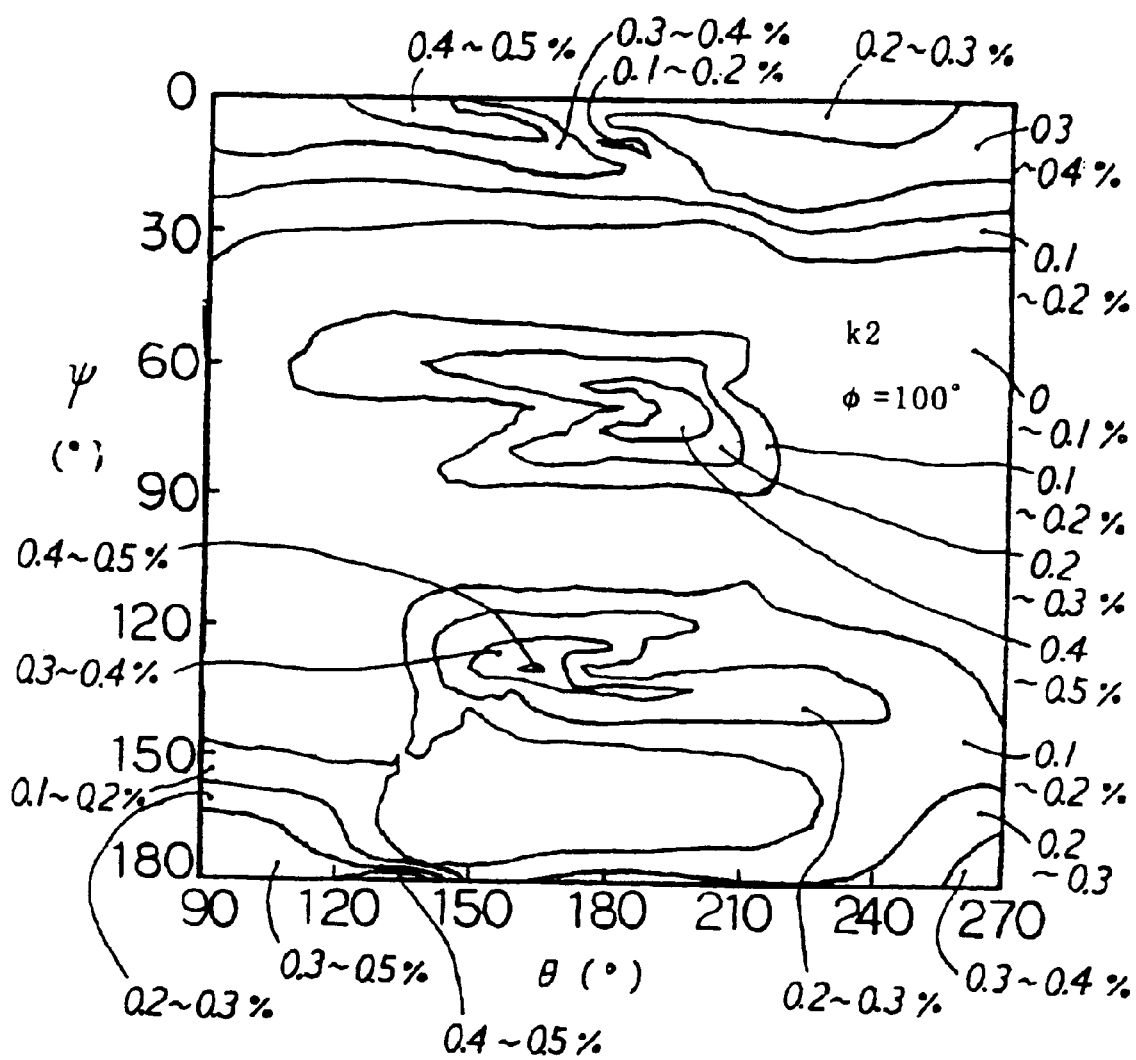
FIG. 8 is a graph indicating the relationship between the direction of propagation and the electro-mechano coupling coefficient ($k^2$) when $\phi=100°$.
Figure 9:
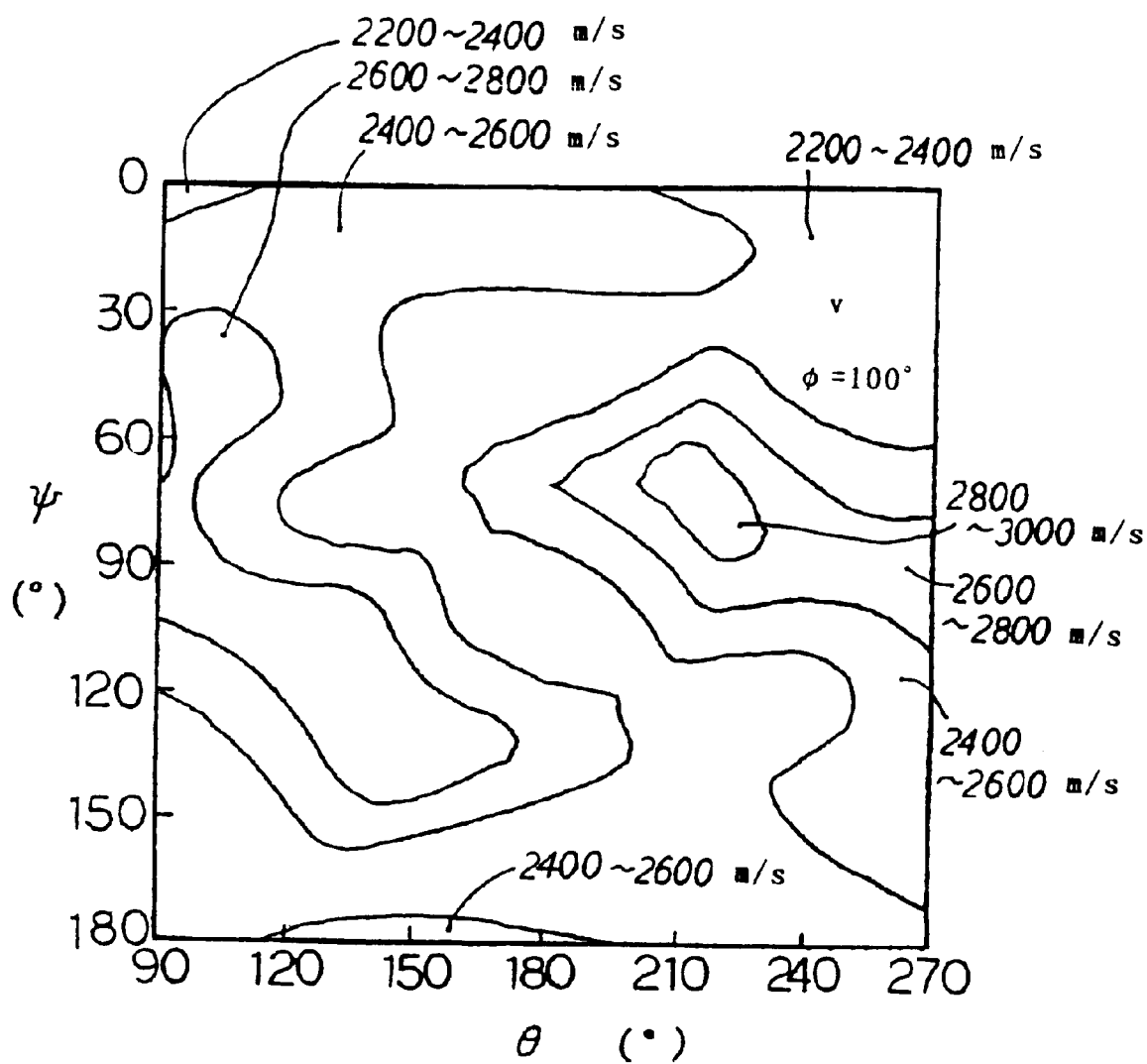
FIG. 9 is a graph indicating the relationship between the direction of propagation and the surface wave velocity (v) when $\phi=100°$.
Figure 10:
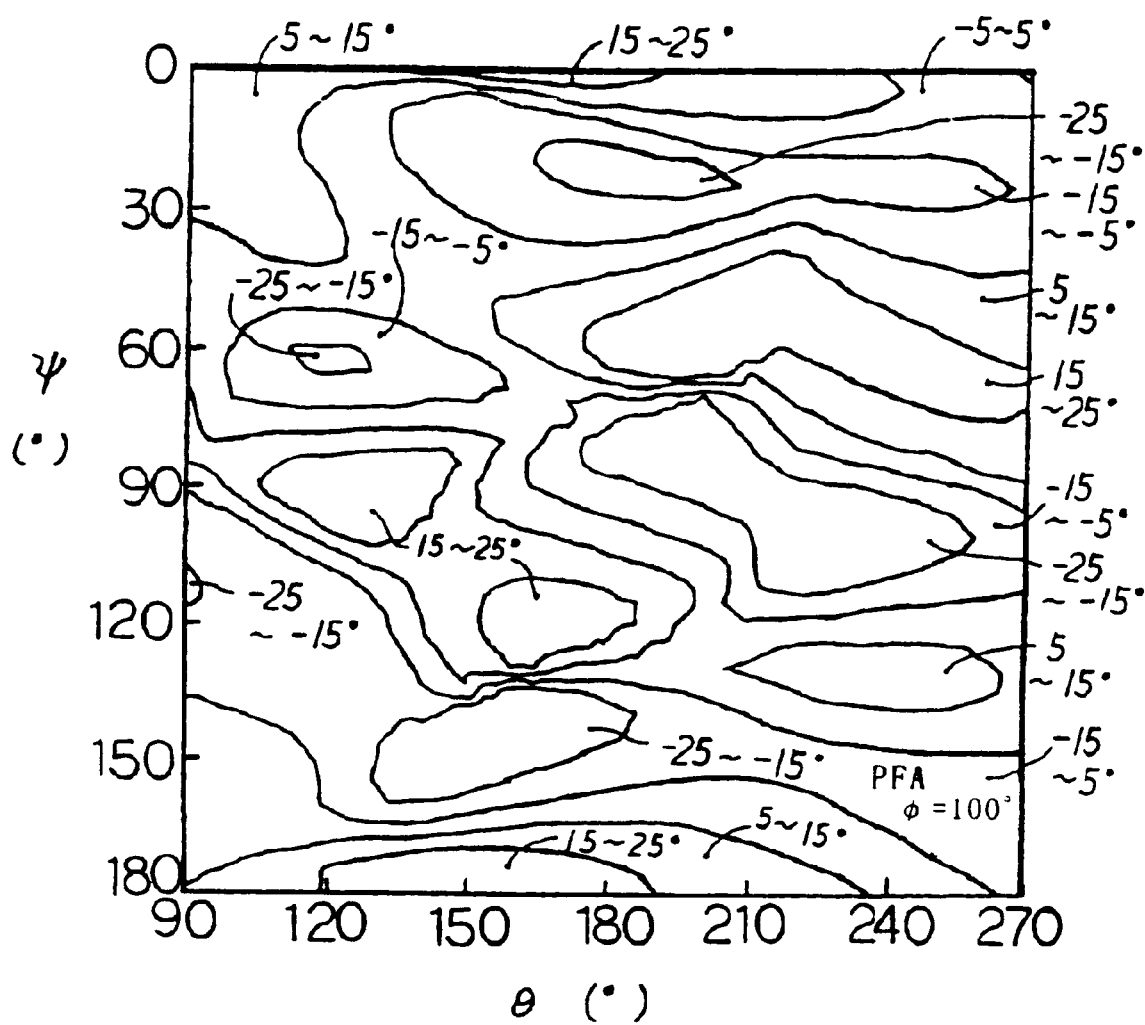
FIG. 10 is a graph indicating the relationship between the direction of propagation and the power flow angle (PFA) when $\phi=100°$.

To be more specific, for example, when $\phi=100°$ and $\theta=90°\sim 270°$ and $\psi=0°\sim 180°$, the iso-characteristic line diagram of TCD is as shown in FIG. 7, the iso-characteristic line diagram of $k^2$ for the above-mentioned range of angles is as shown in FIG. 8, the iso-characteristic line diagram of surface acoustic wave velocity for the above-mentioned range of angles is as shown in FIG. 9, and the iso-characteristic line diagram of PFA for the above-mentioned range of angles is as shown in FIG. 10, respectively.

As for the above-mentioned directions of propagation, because of the symmetry of LGN single crystal of point group P321, periodicities of 60° and of 180° are present for $\phi$ and $\theta$, respectively. For example, $\phi=10°=70°=130°=190°=250°=310°$ and $\theta=125°=305°$. The angles of $\phi$ and the angles of $\theta$ can be treated as equal angles, respectively.

$k^2$ and TCD of a surface acoustic wave device produced as described above were measured to actually measure a favorable direction of propagation as a band-pass filter. The measurement produced results that are extremely compatible with the results of the above-mentioned simulation. The surface acoustic wave velocity of $La_3Ga_{5.5}Nb_{0.5}O_{14}$ single crystal is approximately from 2600 to 2900 m/s and is relatively small. Hence the device can be reduced in size when it is used as a low frequency filter, and can be favorably used as a band-pass filter.

The surface acoustic wave device is applicable to filters and oscillators of various types as well as surface acoustic wave devices of propagation type and of resonant type and can be modified and implemented within the gist of the present invention. With regard to the composition, any single crystal of an oxide of a series mainly containing lanthanum, gallium and niobium, such as a series in which a part of niobium is substituted with another element such as tantalum ($La_3Ga_{5.5}Nb_xTa_{0.5-x}O_{14}$ where $x\leq 0.5$) can be expected to have similar effects.

Next, more specific embodiments of the present invention will be described.

[Embodiment 1]

2500 g of raw materials for $La_3Ga_{5.5}Nb_{0.5}O_{14}$ single crystal being mixed to a balanced composition was filled in an iron crucible measuring 100 mm in inner diameter $\phi$ and 90 mm in height. The crucible was placed in a high frequency type single crystal growth furnace and the above-mentioned material was melted at about 1500° C. while an atmosphere gas being adjusted to $Ar:O_2=90:10$ as kept to flow in the furnace, and a seed crystal was made to contact the melt to grow a single crystal.

Figure 1:
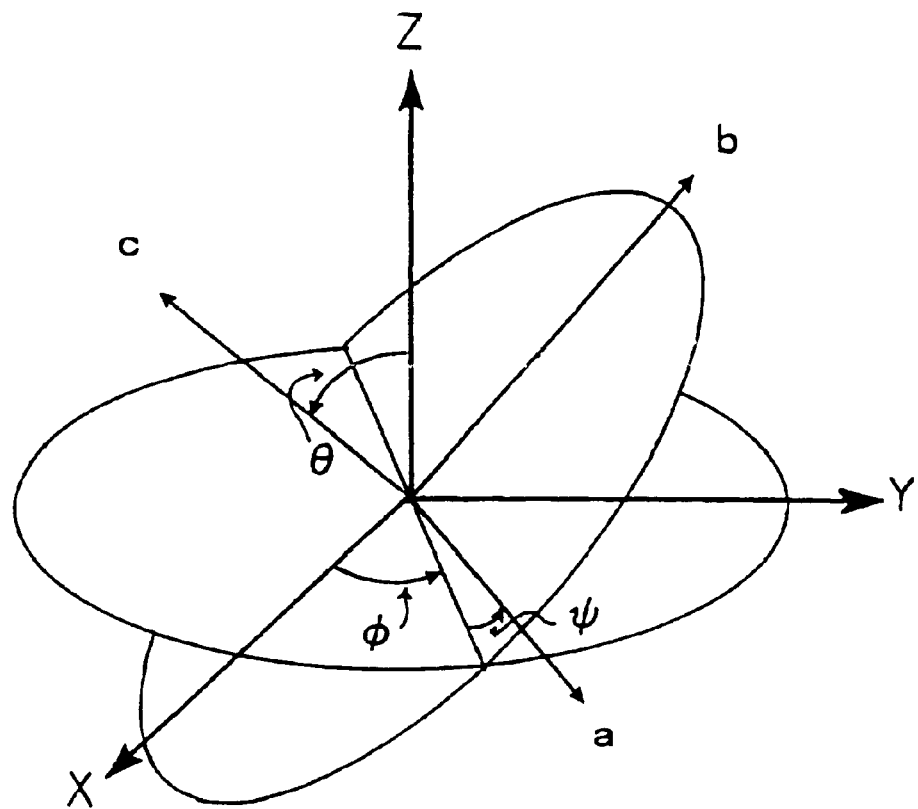
FIG. 1 is a schematic diagram for describing Eulerian angle indication.

Next, a substrate having an optimal cutting plane obtained by the above-mentioned computer simulation or cutting plane of $\phi=50°$ and $\theta=125°$ in Eulerian angle indication as shown in FIG. 1 was cut out of the grown crystal. The substrate was mirror-plane-polished, and as shown in FIG. 2 schematically, excitation electrodes etc. were formed in a specified direction to produce a propagation type surface acoustic wave device S. The width of each electrode digit was about 8 $\mu$m, and the number of electrode digits of the input side electrode $1a$ was 280 and the number of electrode digits of the output side electrode $1b$ was 60. A denotes an alternating-current power source, and B denotes a current detector.

The above-mentioned excitation electrodes were made by forming an aluminum layer of about 3500 Å, thick with the vacuum evaporation process and shaping the layer into comb-shaped electrodes with the lift-off process.

Next, the group retardation temperature coefficient (TCD) and electro-mechano coupling coefficient ($k^2$) of the surface acoustic wave device produced as described above were determined.

As for measurement of TCD, TCD (unit: ppm/° C.) was calculated by the following equation from the ratio of change of the center frequency (it was set at about 47 MHz here) with temperature, and $k^2$ (unit: %) was calculated from the following equation with a network analyzer:

$$TCD = \alpha - (\partial V_0/\partial T)V_{oT} \quad (1)$$

$$k^2 = 2 \times (V_o - V_m)/V_o \times 100 \quad (2)$$

where $\alpha$ is the coefficient of linear expansion in the direction of propagation, Vo is the propagation velocity when the surface of the substrate is electrically open, Vm is the propagation velocity when the surface of the substrate is electrically short-circuited, and $V_{oT}$ is the propagation velocity at 25° C.

As a result of the measurement, TCD and $k^2$ of the surface acoustic wave device in the direction of propagation expressed by, in Eulerian angle indication ($\phi$, $\theta$, $\psi$), $\phi$=50°, $\theta$=125° and $\psi$=70° were approximately 0 (ppm/° C.) and 0.85 (%), respectively. In short, the results were very satisfactory.

[Embodiment 2]

Next, a substrate having an optimal cutting plane obtained by the above-mentioned computer simulation or cutting plane of $\phi$=10° and $\theta$=125° in Eulerian angle indication as shown in FIG. 1 was cut out of the grown crystal. The substrate was mirror-plane-polished, and as shown in FIG. 2 schematically, excitation electrodes etc. were formed in a specified direction to produce a propagation type surface acoustic wave device S. The width of each electrode digit was about 3 μm, and the number of electrode digits of the input side electrode 1a was 280 and the number of electrode digits of the output side electrode 1b was 60. A denotes an alternating-current power source, and B denotes a current detector.

The above-mentioned excitation electrodes were made by forming an aluminum layer of about 3500 Å thick with the vacuum evaporation process and shaping the layer into comb-shaped electrodes with the lift-off process.

Next, the group retardation temperature coefficient (TCD) and electro-mechano coupling coefficient ($k^2$) of the surface acoustic wave device produced as described above were determined.

As for measurement of TCD, TCD (unit: ppm/° C.) was calculated by equation (1) from the ratio of change of the center frequency (it was set at about 79 MHz here) with temperature. $k^2$ (unit: %) was calculated by equation (2) with a network analyzer.

As a result of the measurement, TCD and $k^2$ of the surface acoustic wave device in the direction of propagation expressed by, in Eulerian angle indication ($\phi$, $\theta$, $\psi$), $\phi$=10°, $\theta$=35° and $\psi$=70° were approximately 0 (ppm/° C.) and 0.88 (%), respectively. In short, the results were very satisfactory.

[Embodiment 3]

2500 g of raw materials for $La_3Ga_{5.5}Nb_{0.50}O_{14}$ single crystal being mixed to a balanced composition was filled in an iron crucible measuring 100 mm in inner diameter $\phi$ and 90 mm in height. The crucible was placed in a high frequency type single crystal growth furnace and the above-mentioned material was melted at about 1500° C. while an atmosphere gas being adjusted to Ar:$O_2$=90:10 was kept to flow in the furnace, and a seed crystal was made to contact the melt to grow a single crystal.

Figure 11:
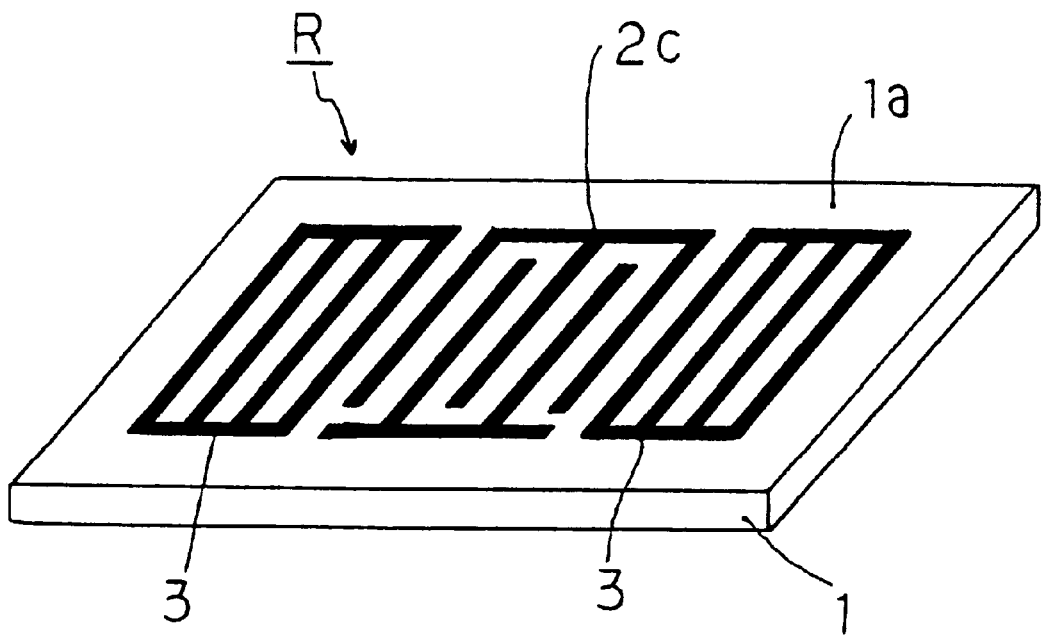
FIG. 11 is a perspective view showing a resonant surface acoustic wave device used in the actual measurement.

Next, a substrate having optimal cutting angles obtained by the above-mentioned computer simulation or cutting plane of $\phi$=100° and $\theta$=145° in Eulerian angle indication as shown in FIG. 1 was cut out of the grown crystal. The substrate was mirror-plane-polished, and a surface acoustic wave device R as shown in FIG. 11 schematically was produced. In other words, on the substrate 1 comprising the above-mentioned single crystal, IDT electrodes having 100 pairs of electrode digits measuring approximately 3 μm in width were formed and reflector electrodes having 300 electrode digits were formed to pinch the IDT electrodes in such a way that the surface acoustic wave (Rayleigh wave) was propagated in a desired direction to produce the resonant surface acoustic wave device R.

The above-mentioned electrodes were made by forming an aluminum layer of approximately 3500 Å thick with the vacuum evaporation process and shaping the layer into comb-shaped and ladder-shaped electrodes with the lift-off process.

Next, TCD, $k^2$ and surface acoustic wave velocity v of the surface acoustic wave device produced as described above were determined.

Figure 12:
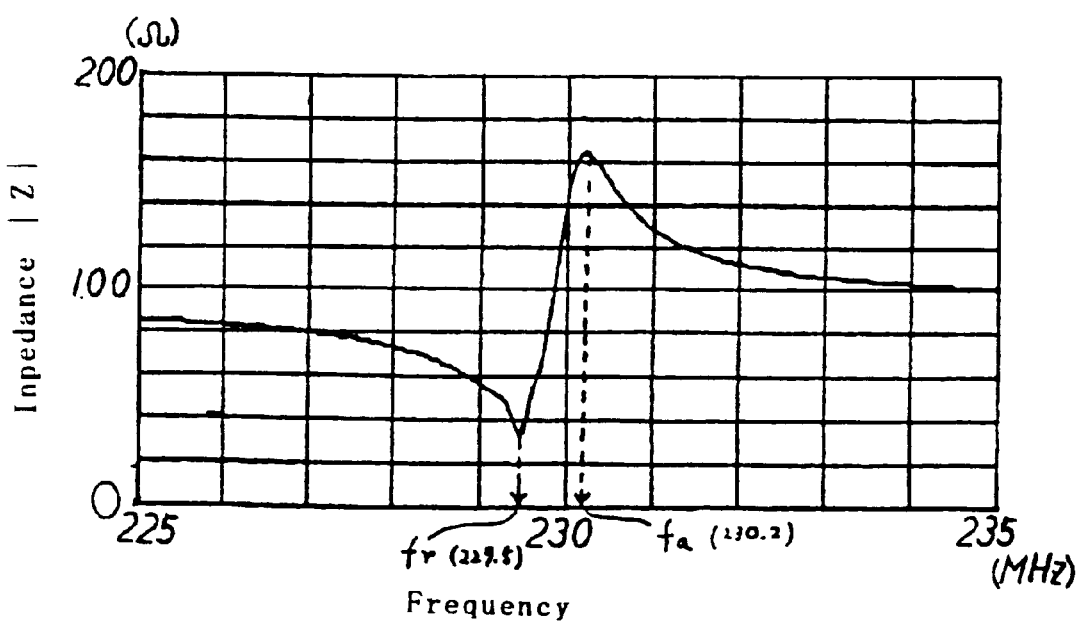
FIG. 12 is a graph showing a measured waveform of resonance characteristics.

As for TCD measurement, TCD was calculated by equation (1) from the ratio of change of the center frequency (for example, 79 MHz) with temperature, and $k^2$ and v were calculated by the following equations with a network analyzer. $k^2$ determined by the equation below is equivalent to $k^2$ determined by equation (2).

$$k^2 = (\pi/2) \cdot (fr/fa) \cdot \tan((\pi/2) \cdot (fa-fr)/fa) \times 100 \; [\%]$$

$$v = fr \times \lambda \; [m/s]$$

Where fr: resonant frequency; fa: anti-resonant frequency; $\lambda$: surface wave wavelength (4 times as large as the width of electrode digit). An example of measurement results of the frequency and impedance of the surface acoustic wave device R is shown in FIG. 12.

On the basis of the results of the measurement, TCD and $k^2$ of the surface acoustic wave device in the direction of propagation expressed in Eulerian angle indication ($\phi$, $\theta$, $\psi$) by $\phi$=100°, $\theta$=155° and $\psi$=130° were approximately 0 (ppm/° C.) and approximately 0.4 (%), respectively. v was 2650 (m/s) and the power flow angle was 0°. In short, the results were very favorable.

On the basis of results of other measurements, results comparable to the above-mentioned results were obtained for a range of $$(\phi, \theta, \psi) = (100°, 145° \sim 155°, 125° \sim 130°).$$

[Embodiment 4]

Next, a substrate having optimal cutting angles obtained by computer simulation or cutting plane of $\phi$=100° and $\theta$=200° in Eulerian angle indication as shown in FIG. 1 was cut out of a single crystal of $La_3Ga_{5.5}Nb_{0.5}O_{14}$ grown in a manner similar to embodiment 3. The substrate was mirror-plane-polished. Then in a manner similar to embodiment 3, on the substrate 1, electrodes etc. comprising IDT electrodes having 100 pairs of digits measuring approximately 3 μm in width and reflector electrodes having 300 digits were formed so that the surface the surface acoustic wave (Rayleigh wave) was propagated in a desired direction to produce a resonant surface acoustic wave device R.

The above-mentioned electrodes were made in a manner similar to embodiment 3 by forming an aluminum layer of approximately 3500 Å thick with the vacuum evaporation process and shaping the layer into comb-shaped electrodes with the lift-off process.

Next, group retardation temperature coefficient (TCD), electro-mechano coupling coefficient ($k^2$) and surface wave velocity (v) of the surface acoustic wave device produced as described above were determined.

Measurement of TCD and calculation of $k^2$ and v were made in a manner similar to embodiment 3. As a result of measurement, TCD and $k^2$ of the surface acoustic wave device in the direction of propagation expressed in Eulerian angle indication ($\phi$, $\theta$, $\psi$) by $\phi=100°$, $\theta=200°$ and $\psi=75°$ were approximately 0 (ppm/° C.) and approximately 0.4 (%), respectively. v was 2750 (m/s) and the power flow angle was 0°. In short, the results were very favorable.

On the basis of results of other measurements, results comparable to the above-mentioned results were obtained for a range of ($\phi$, $\theta$, $\psi$)=(100°, 195°~205°, 65°~75°).

What is claimed is:

1. A surface acoustic wave device wherein an excitation electrode for generating a surface acoustic wave is formed on a substrate made of a single crystal of $La_3Ga_{5.5}Nb_{0.5}O_{14}$ characterized in that cutting angles of said substrate and a direction of propagation of the surface acoustic wave satisfy in Eulerian angle indication ($\phi$, $\theta$, $\psi$) the following equations:

$\phi=41°-56°$;

$\theta=112°-135°$; and $\psi=30°-50°$.

2. A surface acoustic wave device wherein an excitation electrode for generating a surface acoustic wave is formed on a substrate made of a single crystal of $La_3Ga_{5.5}Nb_{0.5}O_{14}$ characterized in that parameters specifying in Eulerian angle indication ($\phi$, $\theta$, $\psi$) cutting angles of said substrate and a direction of propagation of the surface acoustic wave satisfy the following equations:

$\phi=90°-115°$;

$\theta=190°-215°$; and $\psi=50°-90°$.

3. A surface acoustic wave device wherein an excitation electrode for generating a surface acoustic wave is formed on a substrate made of a single crystal of $La_3Ga_{5.5}Nb_{0.5}O_{14}$ characterized in that parameters specifying in Eulerian angle indication ($\phi$, $\theta$, $\psi$) cutting angles of said substrate and a direction of propagation of the surface acoustic wave satisfy the following equations:

$\phi=100°-110°$;

$\theta=125°-165°$; and $\psi=110°-165°$.

* * * * *